United States Patent [19]

Curelop et al.

[11] Patent Number: 5,743,581
[45] Date of Patent: Apr. 28, 1998

[54] SEMICONDUCTOR PROCESS CHAMBER EXHAUST PORT QUARTZ REMOVAL TOOL

[75] Inventors: Bradley Mitchell Curelop, Sunnyvale; James Hann, Santa Clara, both of Calif.

[73] Assignee: Applied Materials Incorporated, Santa Clara, Calif.

[21] Appl. No.: 819,962

[22] Filed: Mar. 18, 1997

[51] Int. Cl.$^6$ .................................................... B25B 27/06
[52] U.S. Cl. ......................... 294/97; 29/268; 29/280; 294/902
[58] Field of Search ............................ 294/11, 16, 93, 294/95, 97, 106, 118, 902; 29/223, 268, 270, 278, 280, 281, 282; 81/415, 418, 421

[56] References Cited

U.S. PATENT DOCUMENTS

| | | | |
|---|---|---|---|
| 1,099,355 | 6/1914 | Gleason et al. | 29/223 |
| 2,364,953 | 12/1944 | Daley | 29/280 X |
| 2,990,213 | 6/1961 | Kolacinski | 294/118 |
| 3,933,346 | 1/1976 | Carver | 294/93 X |
| 4,831,905 | 5/1989 | Murchison | 294/97 X |
| 5,371,658 | 12/1994 | Christie | 294/97 X |

*Primary Examiner*—Johnny D. Cherry

[57] ABSTRACT

A tool for removing a quartz insert from an exhaust port of a semiconductor process chamber. In one embodiment, the tool of the present invention comprises a pair of generally elongated members (a first elongated member and a second elongated member) that are hingedly attached at a middle portion of each member. The first elongated member includes a first handle portion and a first end portion that are located on opposite ends of the middle portion of the elongated member. The second elongated member includes a second handle portion and a second end portion. The first and second handle portions are of sufficient length so as to be gripped by a user. A first head and a second head are pivotally attached to the first and second end portion of the first and second elongated members, respectively. Each head includes a face made of a pliable, gripping material, such as silicon rubber, for engaging the inner side wall surfaces of a quartz insert that is located within the exhaust port of a semiconductor processing chamber. The quartz insert is removed by inserting the first and second heads into the through bore opening of the quartz insert and moving the first and second handle portions outward away from one another such that the face of each head is in abutting engagement with the inner side wall surfaces of the quartz insert. Removal of the quartz insert is achieved by urging the first and second handle portions towards one another and pulling on the handle portions to slide the quartz insert out of the exhaust port opening.

15 Claims, 4 Drawing Sheets

SEMICONDUCTOR PROCESS CHAMBER EXHAUST PORT QUARTZ REMOVAL TOOL

FIELD OF THE INVENTION

The present invention relates to a tool for removing a quartz insert from an exhaust port of a semiconductor process chamber.

BACKGROUND OF THE INVENTION

The process of depositing layers on a semiconductor wafer (or substrate) usually involves heating the substrate and holding the wafer within a stream of deposition (or process) gas flowing around the wafer. FIG. 1A is a simplified illustration of a typical semiconductor processing chamber that might be used for producing layers on a wafer during the fabrication of semiconductor devices.

Process chamber 100 includes a housing for facilitating the flow of a process gas over the surface of a wafer. The housing includes a baseplate 116 having a gas inlet port 126 and a gas exhaust port 128. An upper clamp ring 122 and a lower clamp ring 124 act to hold a quartz upper dome 118 and a quartz lower dome 120 in place. An upper and lower quartz liner (not shown) is typically disposed between the upper and lower domes. Process gas is injected into the process chamber 100 through an injection cap 130 which is connected to a gas source via piping 134. Residual process gas and various waste products are continuously removed from the interior of chamber 100 by an abatement which is coupled to chamber 100 by an exhaust line 133. Process gas and waste products exit the interior of chamber 100 through the exhaust port 128 and an exhaust cap 132. Exhaust port 128 contains a quartz insert 136. A susceptor 112 holds the wafer in position, during the semiconductor/layer deposition process. Generally, a susceptor support shaft 114 is coupled to susceptor 112 for rotating the wafer during the semiconductor fabrication process.

FIG. 1B illustrates a top view of baseplate 116. As shown, baseplate 116 contains having two exhaust ports 128a and 128b which comprise apertures that extend from the inner wall 150 to the outer wall 152 of the baseplate. FIG. 2 illustrates a perspective view of the quartz insert 136 that is used to line the internal surfaces of exhaust port 128a. It is appreciated that a quartz insert in the mirror-image of insert 136 may be used to line the internal surfaces of exhaust port 128b. The outer width dimensions of quartz insert 136 are generally only slightly smaller than the inner width of exhaust port aperture 128a. The side walls 164 and 166 of quartz insert 136 have essentially the same length as exhaust port aperture side walls 154 and 156, respectively.

During semiconductor processing, ideally the injected process gas would deposit only on the wafer substrate surface; however, in reality, some gas molecules miss the substrate surface and deposit on the process chamber surfaces. Preferably, all portions of the chamber potentially exposed to corrosive process chamber gases are made from quartz or other material that is resistant to corrosion induced by the process gas deposits and residue.

When the build-up of surface deposits on the inside of the processing chamber surfaces becomes thick/certain process problems can occur. To avoid these problems, the inside surfaces of the processing chamber are periodically cleaned to remove the material deposited by the process gas. To inhibit the oxidation of process gas deposits (e.g., hydrochloric acid and silicon source gas deposits), a nitrogen purge is generally established within the process chamber during the removal and cleaning of the various chamber components. A particular problem exists, however, in the removal of the exhaust port quartz inserts. Since process gas deposits exist between the outer wall surfaces of the exhaust port quartz inserts and the inner wall surfaces of the exhaust port apertures, the slightest exposure of such deposits to air will cause the deposits to oxidize, thus causing the outer walls of the quartz inserts to bond to the inner surfaces of the exhaust port apertures. Thus, it is imperative that the quartz inserts be quickly removed from the exhaust port apertures after the chamber is opened for cleaning; otherwise, bonding will occur between the quartz inserts and aperture walls making it very difficult to remove the quartz inserts.

Currently, an exhaust quartz insert, such as quartz insert 136, is removed from the exhaust port aperture 128a of baseplate 116 in one of two ways. The first method includes the removal of the exhaust cap and the use of a chisel, or other blunt object, to force the quartz insert out of the exhaust port. Since a significant amount of time is required to remove the exhaust cap in order to gain access to the quartz insert during this procedure, the outer walls of the quartz insert often bond with the inner walls of the exhaust port aperture before the quartz insert is successfully removed. As a result, the quartz insert 136 must often be removed by chipping it out of the exhaust port aperture 128a.

A second method that has been used remove a quartz insert from an exhaust port includes the use of a standard set of pliers. To effect removal of the quartz insert, the handle portions of the pliers are inserted into the through opening of the quartz insert and forced outward and twisted so as to engage the walls of the quartz insert. Removal of the quartz inert is attempted by pulling the pliers in an outward direction while applying the outward and torsional forces to the plier handles. Since the friction coefficient between the plier handles and quartz insert walls is small (smooth metal surface of pliers engaging the smooth quartz surface), the plier handles tend to slip while attempting to remove the quartz insert from the exhaust port aperture. In addition, since the handle portion of the pliers are generally curved, the contact area between the plier handles and quartz insert walls is small, thus enhancing the slippage problem associated with this unorthodox use of pliers. Moreover, since the use of standard pliers requires the application of at least three forces (two directional forces and one torsional force), the ability to manipulate the pliers to apply the necessary combination of forces needed to remove the quartz insert from the exhaust port aperture is greatly limited. Other problems, such as scratching of the quartz insert surfaces and breakage of the quartz insert are also possible when the handles of standard pliers are used in the attempt to remove the quartz inserts from the process chamber exhaust ports.

What is needed then is an apparatus which solves the problems associated with removing a quartz insert from the exhaust port of a semiconductor process chamber. As will be seen, the present invention provides quartz insert removal tool that solves the aforementioned problems.

SUMMARY OF THE INVENTION

The present invention relates to a tool for removing a quartz insert from an exhaust port of a semiconductor process chamber. In one embodiment, the tool of the present invention comprises a pair of generally elongated members (a first elongated member and a second elongated member) that are hingedly attached at a middle portion of each member. The first elongated member includes a first handle portion and a first end portion that are located on opposite ends of the middle portion of the elongated member. The second elongated member includes a second handle portion, a middle portion, and a second end portion. The first and second handle portions are of sufficient length so as to be gripped by a user. A first head and a second head are pivotally attached to the first and second end portions of tile first and second elongated members, respectively. Each head includes a face made of a pliable, gripping material, such as silicon rubber, for engaging the inner side wall surfaces of a quartz insert that is located within the exhaust port of a semiconductor processing chamber. The quartz insert is removed by inserting the first and second heads into the through bore opening of the quartz insert and squeezing the first and second handle portions inward toward one another such that the face of each head is in abutting engagement with the inner side wall surfaces of the quartz insert. Removal of the quartz insert is achieved by then pulling on the handle portions to slide the quartz insert out of the exhaust port opening.

BRIEF DESCRIPTION OF THE DRAWINGS

The present invention is illustrated by way of example and is not limited by the figures of the accompanying drawings, in which like references indicate similar elements, and in which:

FIG. 1B illustrates a top view of the baseplate of the semiconductor processing chamber depicted in FIG. 1a.

DETAILED DESCRIPTION

A tool for removing a quartz insert from an exhaust port of a semiconductor process chamber is disclosed. In the following description, numerous specific details are set forth, such as material types, dimensions, etc., in order to provide a thorough understanding of the present invention. However, it will be obvious to one of ordinary skill in the art that the invention may be practiced without these specific details. In other instances, well-known structures and processing steps have not been shown in particular detail in order to avoid unnecessarily obscuring the present invention.

Figure 2:
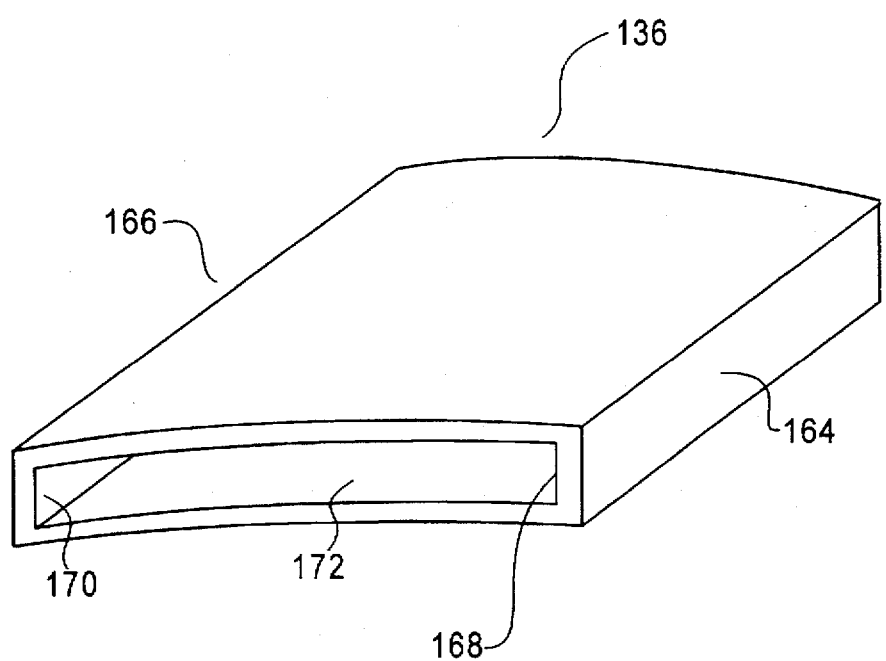
FIG. 2 illustrates a perspective view of a quartz insert that may be used within an exhaust port aperture of a semiconductor processing chamber.
Figure 3:
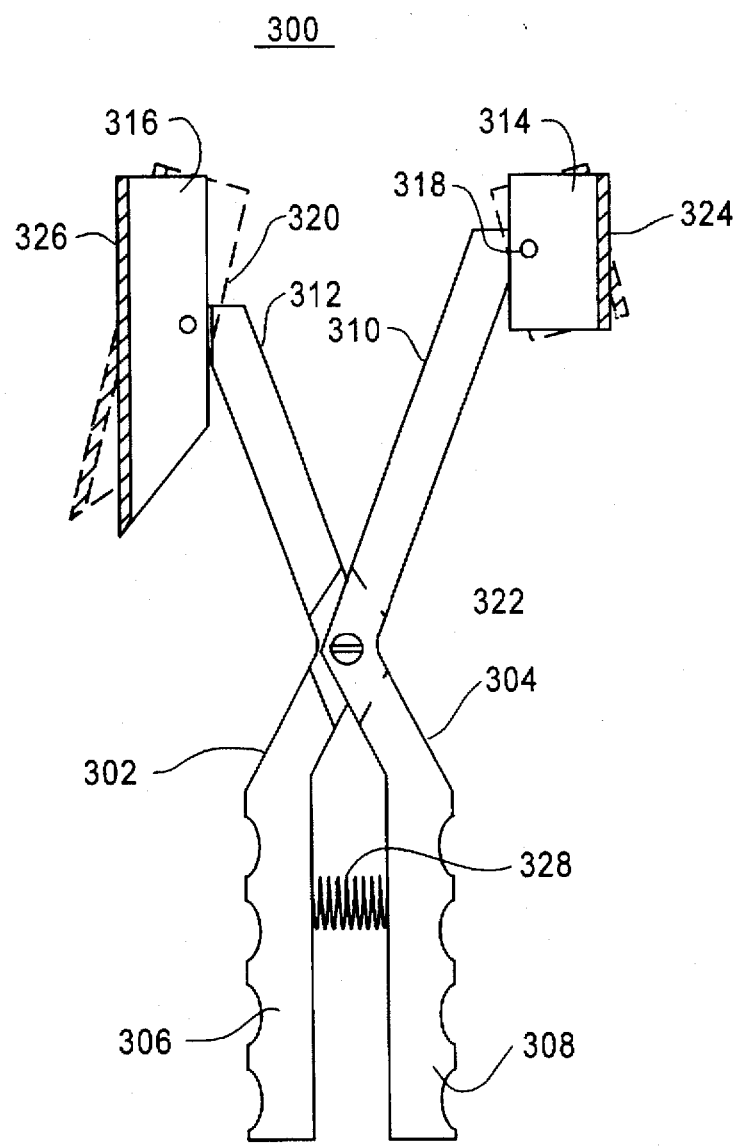
FIG. 3 illustrates a front view of a quartz insert removal tool in accordance with one embodiment of the present invention.

With reference to FIG. 3, a front view of a quartz insert removal tool 300 of one embodiment of the present invention is shown. Tool 300 is adapted to remove a quartz insert, such as the one depicted in FIG. 2, from the exhaust port of a semiconductor processing chamber.

Tool 300 includes a first elongated member 302 and a second elongated member 304 that are hingedly attached at a first middle portion and a second middle portion, respectively, at pivot 322. First elongated member 302 includes a first handle portion 306 and a first end portion 312 that are located along opposite ends of first elongated member 302. Second elongated member 304 is typically a mirror image of first elongated member 302 and also includes a handle portion 308 and an end portion 310. The first and second handle portions are of sufficient length so as to be gripped by a user. In one embodiment a spring 328 or other type of resilient member is disposed between the first and second handle portions 306 and 308 to urge the handle portions away from one another.

A first head 314 and a second head 316 are pivotally attached to the first end portion 310 and the second end portion 312 at pivots 318 and 320, respectively. First head 314 includes a first face 324 that is made of a pliable, gripping material, such as silicon rubber, for engaging an inner side surface of an exhaust port quartz insert. Second head 316 also includes a second face 326 made of a pliable, gripping material for engaging an inner side surface of a quartz insert. In particular, tool 300 is adapted to remove the quartz insert 136 of FIG. 2 from the exhaust port of a semiconductor processing chamber. In accordance with one embodiment of the present invention, first face 324 is sized to engage the inner side wall surface 168 of quartz insert 136. Second face 326 is accordingly sized to engage the inner side wall surface 170 of quartz insert 136. Preferably, the length of faces 324 and 326 are substantially the same length as side walls 168 and 170, respectively. In one embodiment, the width dimension of faces 324 and 326 are only slightly smaller than the height dimensions of side walls 168 and 170, respectively. In this manner, a maximum contact surface area is achieved between tool 300 and quartz insert 136. By maximizing the contact area between the tool faces 324 and 326 and the side walls of the quartz insert, the likelihood of slippage is greatly reduced while the quartz insert is being removed.

The pivotal attachment of heads 314 and 316 to end portions 310 and 312 serves to ensure that a maximum achievable contact area between faces 324 and 326 with side walls 168 and 170 is achieved. The pivotal attachment of heads 314 and 316 to end portions 310 and 312 also reduces the possibility of binding the tool heads within the quartz insert. Typically, heads 314 and 316 have a degree of rotation of approximately 5 to 20 degrees in either a clockwise or a counter-clockwise rotation. It is appreciated however, that a larger or smaller degree of motion may be used depending upon the particular removal application.

Elongated members 302 and 304 are typically made of a metal material, such as stainless steel. The handle portion is sized as to be grasped easily by the user of the tool. First and second heads 314 and 316 may be made of hard plastic. In one embodiment faces 324 and 326 comprise pads that are secured to heads 314 and 316, respectively. In such an embodiment, the pads comprise a pliable material that is able to grip the inner side wall surfaces of the quartz insert. For example, the face pads may comprise silicon rubber. In addition to enhancing the gripping action of the tool, the pliable, gripping faces 324 and 326 of heads 314 and 316 also reduce the likelihood of damaging the quartz insert during the removal process. In lieu of using face pads, heads 314 and 316 may be coated with a material that is able grip the side wall surfaces of the quartz insert while a compression force is being applied to the tool heads 314 and 316.

Figure 1A:
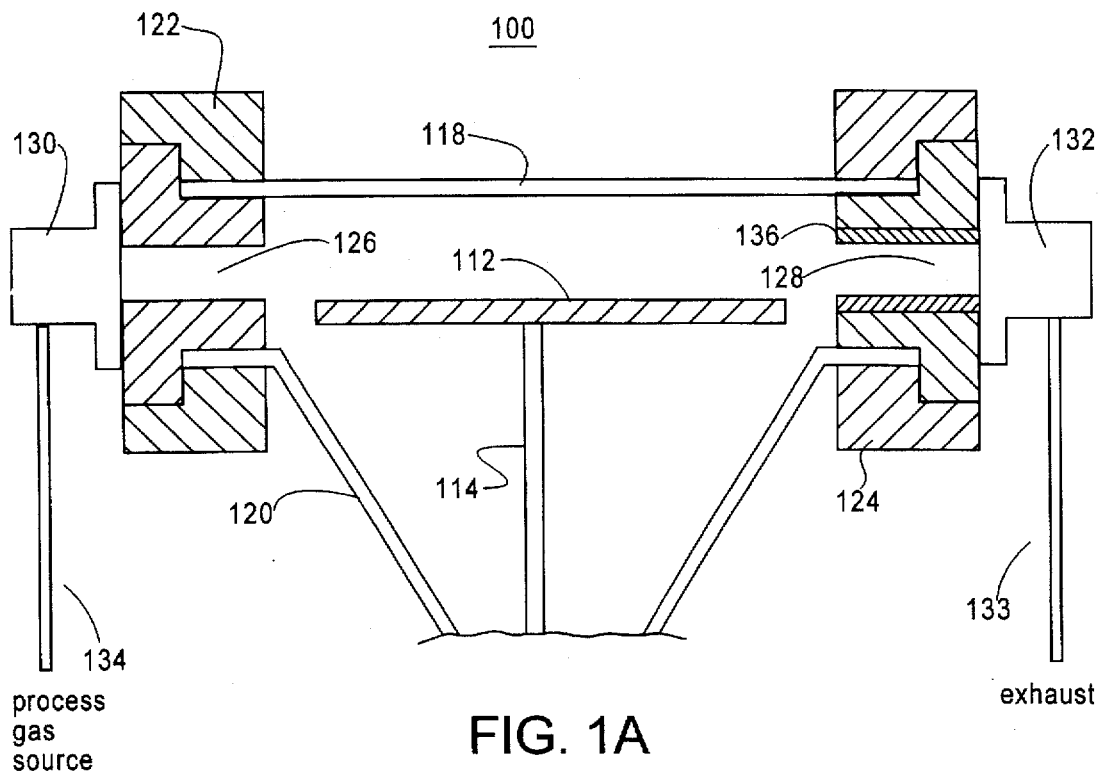
FIG. 1A illustrates a simplified cross-sectional view of a semiconductor processing chamber.
Figure 1B:
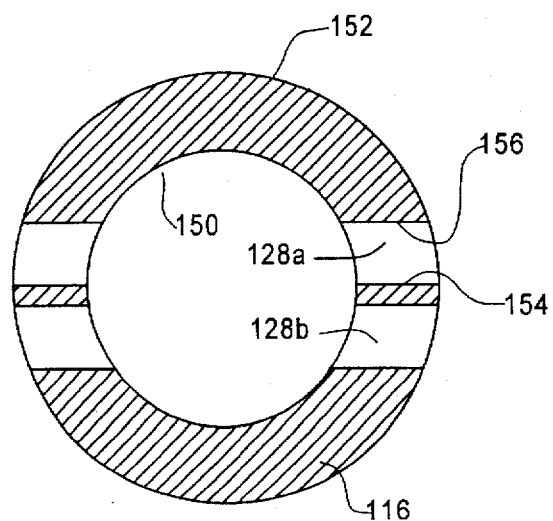

In accordance with the present invention, quartz insert 136 of FIG. 2 is removed from the exhaust port aperture 128a of FIG. 1A by inserting first and second heads 314 and 316 into the through bore 172 of quartz insert 136 and squeezing first and second handle portions 306 and 308 inward toward one another such that first and second faces 324 and 326 are in abutting engagement with quartz insert inner side walls 168 and 170, respectively. Removal of the quartz insert from the exhaust port is then achieved by the user pulling on the handle portions to slide the quartz insert out of the exhaust port opening. It is appreciated that the present invention may be adapted for use with automated or semi-automated machinery.

In one embodiment, tool 300 has an over length of approximately 9 to 10 inches with the handle portions being about 4 to 5 inches. The length of faces 324 and 326 will vary depending upon the dimensions of the quartz insert to be removed. In an exemplary embodiment, first face 324 has a length in the range of 1 to 2 inches, whereas second face 326 has a length in the range of 2 to 4 inches. The thickness of faces 324 and 326 is in the range of 0.125 and 0.25 inches.

Figure 4:
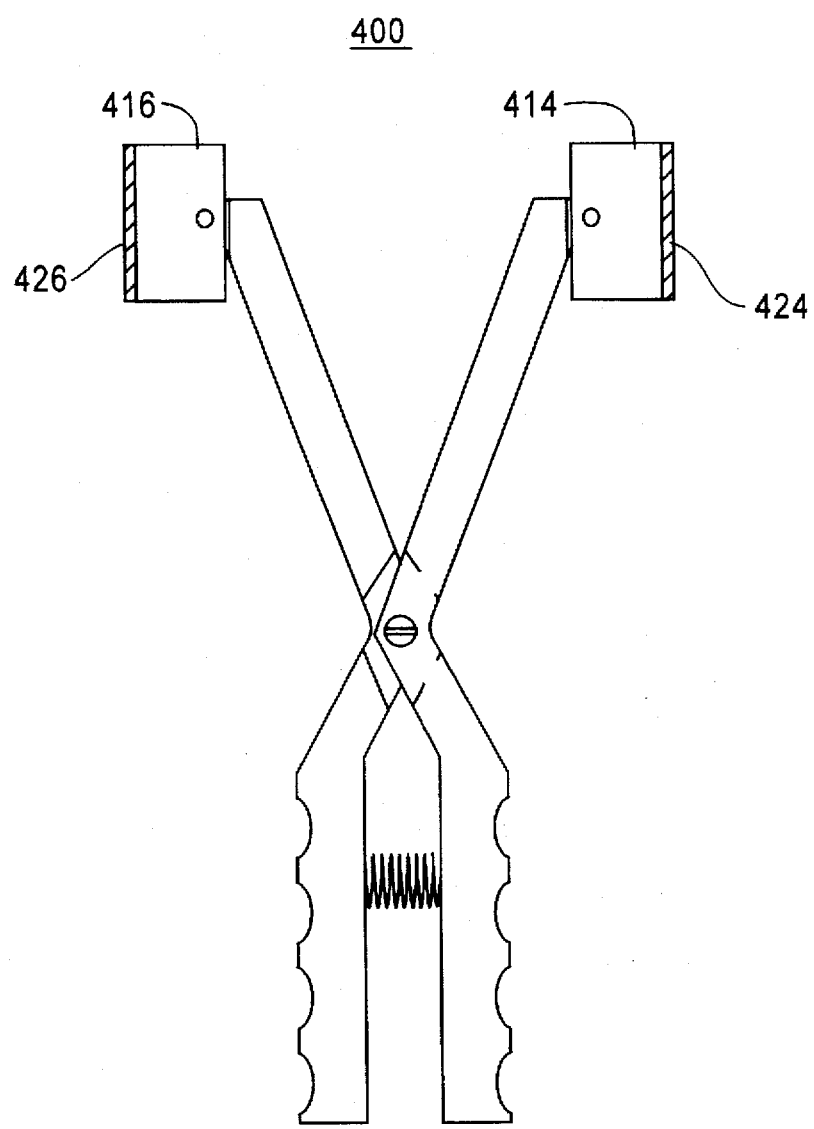
FIG. 4 illustrates a front view of a quartz insert removal tool in accordance with another embodiment of the present invention.

In the foregoing discussion, the size of faces 324 and 326 have been described as having substantially the same length and width as quartz insert side walls 168 and 170. It is appreciated, however, that the present invention is not limited to such a requirement. For example, a tool having engaging pads and/or faces having a length greater than or less than the length of their respective quartz insert side wall surfaces may be used. In addition, it is important to note that the dimension of the tool faces 324 and 326 may be varied in accordance with specific design requirements to ensure that adequate compression forces are applied at the tool face and quartz insert wall interfaces to minimize the likelihood of slippage between the faces and side walls. FIG. 4 illustrates a tool 400 of the present invention wherein the heads 414 and 416 and their respective faces 424 and 426 have the same dimensions.

It is readily apparent that the present invention offers a number of advantages over the prior art methods of removing quartz inserts from the exhaust ports of semiconductor processing chambers. The present invention provides a quartz insert removal tool that is easily managed by the user's hands. Moreover, the quartz insert removal tool of the present invention is adapted to engage and maintain non-slippage contact with the quartz insert during the removal process.

It is understood that the relative dimensions, geometric shapes, materials and process techniques set forth within the specification are exemplary of the disclosed embodiments only. Whereas many alterations and modifications to the present invention will no doubt become apparent to a person ordinarily skilled in the art having read the foregoing description, it is to be understood that the particular embodiments shown and described by way of illustration are in no way intended to be limiting. Therefore, reference to the details of the illustrated diagrams is not intended to limit the scope of the claims which themselves recite only those features regarded as essential to the invention.

What is claimed is:

1. A gripping tool for gripping and maintaining non-slipping gripping engagement between said tool and a quartz insert located within a gas exhaust port of a semiconductor process chamber, said quartz insert having a through bore, said through bore containing a first side of a first length and a second side of a second length, said second side being parallel to said first side, said gripping tool comprising:

a first elongated member having a first handle portion, a first middle portion, and a first end portion, said first middle portion being disposed between said first handle and said first end portions;

a second elongated member having a second handle portion, a second middle portion, and a second end portion, said second middle portion being disposed between said second handle and said second end portions, said first and second elongated members being pivotally attached at said first and said second middle portions;

a first head pivotally attached to said first end portion, said first head having a first face for engaging said first side of said quartz insert, said first face comprising an elastomeric material for gripping said first side of said quartz insert; and a second head pivotally attached to said second end portion, said second head having a second face for engaging said second side of said quartz insert, said second face comprising an elastomeric material for gripping said second side of said quartz insert;

said first and second handle portions configured to receive a force for engaging said first and second faces with said first and second side surfaces of said quartz insert, respectively.

2. The gripping tool of claim 1 wherein said first and second elongated members are made of stainless steel.

3. The gripping tool of claim 1 wherein said first and second heads are made of plastic.

4. The gripping tool of claim 1 wherein said first face comprises an engaging pad that is secured to said first head and said second face comprises a second engaging pad that is secured to said second head.

5. The gripping tool of claim 1 wherein said first and second faces are made of silicon rubber.

6. The gripping tool of claim 4 wherein said first and second engaging pads are made of silicon rubber.

7. The gripping tool of claim 1 wherein said first face and said second face have a length that is substantially the same as said first length and said second length of said side surfaces, respectively.

8. The gripping tool of claim 1 further comprising a resilient member disposed between said first handle portion and said second handle portion for urging said first and second handle portions away from one another.

9. The gripping tool of claim 1 wherein said first and second handle portions have a length in the range of 4–6 inches and a thickness in the range of 0.125 to 0.25 inches.

10. The gripping tool of claim 1 wherein said first head has a length in the range of 1 to 2 inches.

11. The gripping tool of claim 1 wherein said second head has a length in the range of 2 to 4 inches.

12. The gripping tool of claim 1 wherein said first and second heads have substantially the same length.

13. A method for removing a quartz insert from an exhaust port of a semiconductor processing chamber, said quartz insert having a through bore containing a first side of a first length and a second side of a second length, said method comprising the steps of:

(a) inserting a gripping tool having a first head and a second head into said through opening of said quartz, said first and said second heads having a first face and a second face, respectively, each of said first and second faces comprising an elastomeric material for gripping said sides of said quartz insert;

(b) applying a first force to said first and second faces so as to place said first and second faces in abutting engagement with said first and said second sides of said quartz insert, respectively; and (c) applying a second force simultaneous to applying said first force to urge said quartz insert out of said exhaust port of said semiconductor processing chamber.

14. The method of claim 13 wherein the step of applying said first force is applied by a human hand.

15. The method of claim 14 wherein the step of applying said second force is applied by a human hand.

* * * * *